US006960925B2

(12) United States Patent  (10) Patent No.: US 6,960,925 B2
Zivanovic  (45) Date of Patent: Nov. 1, 2005

(54) INPUT BUFFER WITH AUTOMATIC SWITCHING POINT ADJUSTMENT CIRCUITRY, AND SYNCHRONOUS DRAM DEVICE INCLUDING SAME

(75) Inventor: Branimir M. Zivanovic, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/300,426

(22) Filed: Nov. 20, 2002

(65) Prior Publication Data

US 2003/0090287 A1    May 15, 2003

Related U.S. Application Data

(63) Continuation of application No. 09/880,617, filed on Jun. 13, 2001, now Pat. No. 6,522,160.

(51) Int. Cl.[7] ............................................. G01R 31/26
(52) U.S. Cl. ................................... 324/765; 324/158.1
(58) Field of Search ............................... 324/763, 765, 324/158.1, 767, 768, 769; 327/77, 72, 63, 327/76, 78, 108, 58, 60; 365/65

(56) References Cited

U.S. PATENT DOCUMENTS

| 3,758,792 A | * | 9/1973 | Heuner et al. ................. 327/61 |
| 4,219,152 A | * | 8/1980 | Couch et al. ........... 235/462.27 |
| 6,522,160 B1 | * | 2/2003 | Zivanovic ................... 324/765 |

\* cited by examiner

Primary Examiner—Vinh Nguyen
Assistant Examiner—Tung X. Nguyen
(74) Attorney, Agent, or Firm—Williams, Morgan & Amerson

(57) ABSTRACT

An input buffer is presented for buffering an input signal having a voltage magnitude which alternates between a first voltage level and a second voltage level, where the first and second voltage levels may vary over time. In one embodiment, the input buffer includes a first and second detector circuits, an average generator circuit, and a differential amplifier. The first detector circuit receives the input signal and produces a first signal having a magnitude indicative of the first voltage level. The second detector circuit receives the input signal and produces a second signal having a magnitude indicative of the second voltage level. The average generator circuit receives the first and second signals, and uses the magnitudes of the first and second signals to produce a third signal having a magnitude indicative of a third voltage level substantially mid way between the first voltage level and the second voltage level. The third voltage level defines a variable an automatically adjusted "switching point". The differential amplifier receives the input signal, the third signal, and a first and second power supply voltages. The differential amplifier amplifies a difference between the voltage magnitude of the input signal and the third voltage level in order to produce an output signal which alternates between the first and second power supply voltages. An integrated circuit is described including the input buffer coupled between one of a set of input/output pads and circuitry, wherein the circuitry may be synchronous dynamic random access memory (SDRAM) circuitry.

30 Claims, 8 Drawing Sheets

INPUT BUFFER WITH AUTOMATIC SWITCHING POINT ADJUSTMENT CIRCUITRY, AND SYNCHRONOUS DRAM DEVICE INCLUDING SAME

This is a continuation of application Ser. No. 09/880,617 filed Jun. 13, 2001, now U.S. Pat. No. 6,522,160.

BACKGROUND OF THE INVENTION

1. Field of the Invention

This invention relates generally to digital logic circuits, and, more particularly, to digital logic circuits which receive signals alternating between two different voltage levels.

2. Description of the Related Art

Digital logic circuits typically quantize signal voltage levels to represent two or more logic levels or states. In positive binary logic, a signal voltage level within a voltage range extending downward from a maximum operating voltage typically represents a logic "high" level (e.g., a logic '1' state), and a signal voltage level within a voltage range extending upward from a minimum operating voltage typically represents a logic "low" level (e.g., a logic '0' state).

Electromagnetic events occurring in and around digital logic circuits produce unwanted "noise" signals. These unwanted noise signals may be coupled into nodes or signal lines of digital logic circuits, causing voltage level variations of logic signals on the nodes or signal lines. For this reason, reliable digital logic circuits incorporate "noise margins" (NM) for both the logic high level ($NM_H$) and the logic low level ($NM_L$). When a noise signal has an amplitude less than $NM_L$, and a logic gate receives a signal at an input representing the logic low level and including the noise signal, the noise signal will be attenuated as the received signal passes from the input to an output of the logic gate. Similarly, when a noise signal has an amplitude less than $NM_H$, and the logic gate receives a signal at an input representing the logic high level an including the noise signal, the noise signal will be attenuated as the received signal passes from the input to an output of the logic gate. As it is equally likely for noise signals to be coupled into signals representing logic low levels and logic high levels, it is desirable that the noise margins $NM_H$ and $NM_L$ be substantially equal.

Power supply conductors used to distribute a "positive" power supply voltage and a reference or "ground" power supply voltage to logic gates of a digital logic circuit have finite electrical resistances and inductances. When the outputs of several of the logic gates change simultaneously, a relatively large switching current "pulse" flows through the power supply conductors. The switching current pulse causes voltage drops across the electrical resistances and inductances of the power supply conductors. As a result, the positive power supply voltage level at the logic gates with changing outputs, and at neighboring logic gates, is momentarily reduced, or "droops." At the same time, the ground power supply voltage level at the logic gates with changing outputs, and at the neighboring logic gates, is momentarily increased, or "bounces." Such power supply droop and ground bounce may generate noise signals within the digital logic circuit. If not attenuated by virtue of noise margins $NM_H$ and $NM_L$, the noise signals may cause the digital logic circuit to produce incorrect output signals.

Dynamic random access memory (DRAM) devices are commonly used to store data (e.g., within computer systems). Modem synchronous DRAM (SDRAM) devices receive an externally generated clock signal, and use the clock signal to synchronize operations with other devices (e.g., an SDRAM controller). Input signal reception and output signal generation are synchronized with voltage level transitions (i.e., edges) of the clock signal. SDRAM devices include multiple "banks" of memory, and performances of SDRAM devices may be increased by interleaving memory accesses among the multiple memory banks in order to hide required signal line precharge times within the SDRAM devices. In addition, input signals received by more conventional DRAM devices determine the functions performed by the DRAM devices. In contrast, input signals received by SDRAM devices represent commands. The commands may be used to program registers within the SDRAM devices which control operations of the SDRAM devices, thus allowing for programmable operation of SDRAM devices.

A clock signal used to synchronize operations of components of a synchronous digital logic circuit (e.g., including an SDRAM device) alternates periodically between a high voltage level and a low voltage level. The high voltage level may be within a voltage range extending downward from a maximum operating voltage representing a logic high level (e.g., a logic '1' state). Correspondingly, the low voltage level may be within a voltage range extending upward from a minimum operating voltage representing a logic "low" level (e.g., a logic '0' state). The operations of the components are typically synchronized to transitions of the clock signal between the high voltage level and the low voltage level (i.e., rising or falling edges of the clock signal). Accordingly, the clock signal must be distributed to the components such that all components "see" the edges of the clock signal at substantially the same time. In the manner described above, finite resistances and inductances of conductors used to distribute clock signals (e.g., clock signal conductors and a ground voltage grid or plane), and/or noise signals coupled into the conductors, may reduce the high voltage level of the clock signal and/or increase the low voltage level of the clock signal.

An input buffer of a component receiving a clock signal (e.g., a logic circuit or a clock signal buffer) typically uses a fixed switching point or "trip point" voltage to produce a "regenerated clock signal." The switching point voltage is typically set to a value mid way between selected "ideal" high and low voltage levels of the clock signal. The received clock signal voltage is compared to the switching point voltage (e.g., via a comparator). If the clock signal voltage is greater than the switching point voltage, the input buffer may produce the regenerated clock signal within an output voltage range extending downward from the maximum operating voltage and representing the logic high level (e.g., the logic '1' state). On the other hand, if the clock signal voltage is less than the switching point voltage, the input buffer may produce the regenerated clock signal within an output voltage range extending upward from the minimum operating voltage and representing the logic low level (e.g., the logic '0' state).

Practical clock signals transition between the low voltage level and the high voltage level in finite amounts of time (i.e., have finite "rise times"), and similarly transition between the high voltage level and the low voltage level in finite lengths of time (i.e., have finite "fall times"). Characterizing such practical clock signals may involve determining a mid voltage level mid way between the high and low voltage levels, and determining "mid points" of rising and falling edges of the clock signal where the rising and falling edges pass through the mid voltage level. The period of such a practical clock signal may be defined as an amount of time between a mid point of a rising edge of the clock signal and a mid point of the next rising edge of the clock signal. The "duty cycle" of a practical clock signal having finite rise and fall times may be defined as a ratio of an amount of time between a mid point of a rising edge of the clock signal to a mid point of the next falling edge to the period of the clock signal.

Where a high voltage level of a clock signal is decreased by an amount when traversing a clock distribution network (i.e., due to conductor electrical characteristics and/or noise signals), and a low voltage level of the clock signal is increased by the same amount, an input buffer employing the above described method for regenerating the clock signal by comparing the clock signal voltage to a fixed switching point voltage may expectedly produce the regenerated clock signal having the same duty cycle as the received clock signal. However, in situations where the high and low voltage levels of the clock signal are changed by different amounts, and when the high and low voltage levels are both increased or both decreased, the regenerated clock signal produced by the input buffer differs from the duty cycle of the received clock signal. As a result of such changes in duty cycle, the components of the digital logic circuit may not "see" the edges of the clock signal at substantially the same time. When determining a minimum period of the clock signal, such variations in edge transition times must be accounted for such that the period of the clock signal is sufficient to allow the digital logic circuit to produce correct output signals despite the variations in edge transition times.

It would thus be advantageous to have an input buffer circuit having a variable switching point dependent upon actual high and low voltage levels of a received input signal (e.g., a clock signal), and not a fixed switching point established based upon ideal high and low voltage levels of the input signal. In a synchronous digital logic system using a clock signal to synchronize component operations, such an input buffer would reduce variations in edge transition times of the clock signal received by the components, thereby allowing the period of the clock signal to be reduced, and the performance of the synchronous digital logic system to be increased.

SUMMARY OF THE INVENTION

An input buffer is presented for buffering an input signal having a voltage magnitude which alternates between a first voltage level and a second voltage level, where the first and second voltage levels may vary over time. In one embodiment, the input buffer includes a first and second detector circuits, an average generator circuit, and a differential amplifier. The first detector circuit receives the input signal and produces a first signal having a magnitude indicative of the first voltage level. The second detector circuit also receives the input signal, and produces a second signal having a magnitude indicative of the second voltage level.

The average generator circuit receives the first and second signals, and uses the magnitudes of the first and second signals to produce a third signal having a magnitude indicative of a third voltage level substantially mid way between the first voltage level and the second voltage level. The third voltage level defines a variable an automatically adjusted "switching point" of the input buffer.

The differential amplifier receives the input signal, the third signal, a first power supply voltage, and a second power supply voltage. The differential amplifier amplifies a difference between the voltage magnitude of the input signal and the third voltage level in order to produce an output signal which alternates between the first and second power supply voltages.

An integrated circuit is described including the input buffer coupled between one of a set of input/output pads and circuitry, wherein the circuitry may be synchronous dynamic random access memory (SDRAM) circuitry.

The input signal may alternate between the first voltage level and the second voltage level periodically, and may have a period and a duty cycle. In this situation, the output signal alternates between the first and second power supply voltages periodically, and has a period substantially equal to the period of the input signal and a duty cycle substantially equal to the duty cycle of the input signal. For example, the input signal may be an input clock signal having a period and a duty cycle, and the output signal may be an output clock signal. In this situation, the output clock signal alternates between the first and second power supply voltages periodically, and has a period substantially equal to the period of the input clock signal and a duty cycle substantially equal to the duty cycle of the input clock signal.

As described above, the third voltage level defines a switching point of the input buffer. A first noise margin of the input buffer may exist between the switching point and the first voltage level of the input signal, and a second noise margin of the input buffer may exist between the switching point and the second voltage level of the input signal. In this situation, the switching point of the input buffer varies with changes in the first and second voltage levels of the input signal such that the first and second noise margins are maintained substantially equal.

For example, the first power supply voltage may be denoted "VDD", and the second power supply voltage may be denoted "VSS", where VDD>VSS. In addition, the first voltage level may be greater than the second voltage level. Power supply voltage VDD may be greater than or equal to the first voltage level, and power supply voltage VSS may be less than or equal to the second voltage level. In this situation, the first noise margin of the input buffer may be a logic high noise margin $NM_H$, and the second noise margin of the input buffer may be a logic low noise margin $NM_L$. The output signal alternates between VDD and VSS, and the switching point of the input buffer varies with changes in the first and second voltage levels of the input signal such that noise margins $NM_H$ and $NM_L$ are maintained substantially equal.

In one embodiment of the input buffer, the first signal is a voltage signal having a voltage magnitude substantially equal to the first voltage level, the second signal is a voltage signal having a voltage magnitude substantially equal to the second voltage level, and the third voltage signal has a voltage magnitude substantially equal to the third voltage level. In this embodiment, the differential amplifier amplifies a difference between the voltage magnitudes of the input signal and the third voltage signal in order to produce the output signal.

For example, as described above, the first power supply voltage may be denoted "VDD", and the second power supply voltage may be denoted "VSS", where VDD>VSS. In addition, the first voltage level may be greater than the second voltage level. Power supply voltage VDD may be greater than or equal to the first voltage level, and power supply voltage VSS may be less than or equal to the second voltage level.

The first detector circuit may include a p-channel metal oxide semiconductor (pMOS) transistor and a capacitor, wherein a source terminal of the pMOS transistor receives the input signal, and the capacitor is coupled between a drain terminal of the pMOS transistor and power supply voltage VSS. Electrical current flows through the pMOS transistor and charges the capacitor when the voltage magnitude of the input signal is the first voltage level and a voltage across the capacitor is substantially less that the first voltage level.

The second detector circuit may include a p-channel metal oxide semiconductor (pMOS) transistor and a capacitor, wherein a drain terminal of the pMOS transistor receives the input signal, and the capacitor is coupled between a source terminal of the pMOS transistor and power supply voltage VDD. Electrical current flows through the pMOS transistor and charges the capacitor when the voltage magnitude of the input signal is the second voltage level and a voltage between the source terminal and the second power supply voltage is substantially greater than the second voltage level.

The average generator circuit may include a pair of resistors connected in series between the first and second voltage signals, wherein the third voltage signal is produced at a connection point between the pair of resistors. The pair of resistors may have substantially equal resistance values such that the third voltage signal is substantially mid way between the first voltage level and the second voltage level.

The differential amplifier may include multiple metal oxide semiconductor (MOS) transistors connected together to form a differential network, and an inverter. The differential network may receive the input signal and the third voltage signal, and may amplify the difference between the voltage magnitudes of the input signal and the third voltage signal to produce an intermediate signal. The inverter may receive the intermediate signal at an input terminal and the first and second power supply voltages, and produce the output signal at an output terminal, wherein the output signal alternates between the first and second power supply voltages.

A circuit is described including an input/output pad adapted to receive the input signal, the above input buffer wherein the first and second detector circuits and the differential amplifier receive the input signal via the input/output pad, and circuitry coupled to receive the output signal of the input buffer and configured to perform a function dependent upon the output signal. The input/output pad, the input buffer, and the circuitry may be formed upon and within a single monolithic semiconductor substrate, forming an integrated circuit. As described above, the input signal may be an input clock signal, and the output signal may be an output clock signal. The circuitry may be SDRAM circuitry which uses the output clock signal to synchronize internal operations.

A method for signal buffering embodied within the input buffer includes receiving the above input signal, producing the first signal having a magnitude indicative of the first voltage level of the input signal, and producing the second signal having a magnitude indicative of the second voltage level of the input signal. The first and second signals are used to produce the third signal having a magnitude indicative of a third voltage level substantially mid way between the first voltage level and the second voltage level of the input signal. The difference between the voltage magnitude of the input signal and the third voltage level are amplified to produce an output signal which alternates between the first power supply voltage and the second power supply voltage.

BRIEF DESCRIPTION OF THE DRAWINGS

The invention may be understood by reference to the following description taken in conjunction with the accompanying drawings, in which like reference numerals identify similar elements, and in which.

Figure 1:
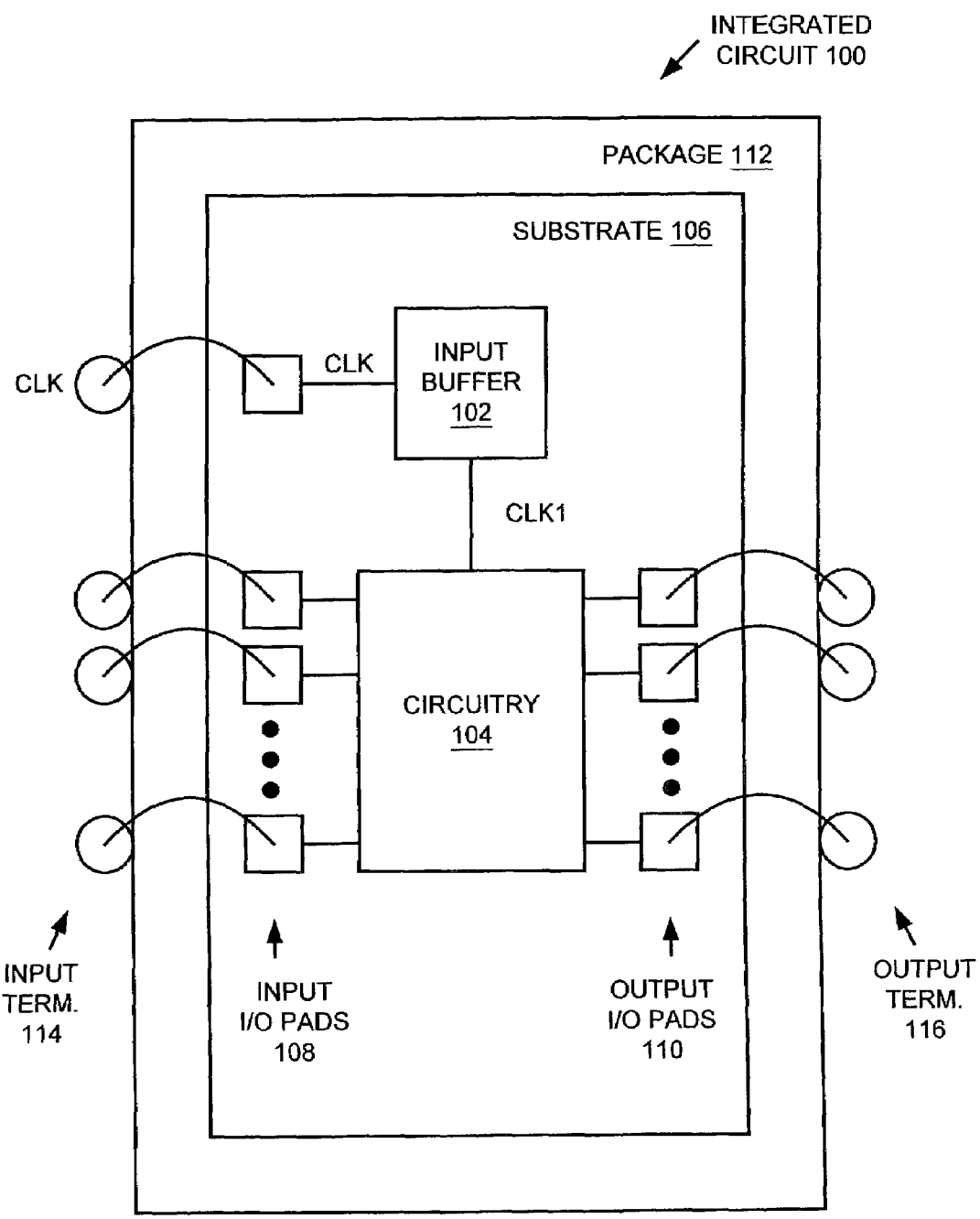
FIG. 1 is a diagram of one embodiment of an integrated circuit including an input buffer coupled between one of a set of electrically conductive input/output (I/O) pads and circuitry, wherein the input buffer, the set of I/O pads, and the circuitry are all formed upon and within a single monolithic semiconductor substrate, and wherein the input buffer receives an input clock signal CLK and produces an output clock signal CLK1.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1 is a diagram of one embodiment of an integrated circuit (IC) 100. IC 100 includes an input buffer 102, circuitry 104, and a set of electrically conductive input/output (I/O) pads, all formed upon and within a single monolithic semiconductor substrate 106. The set of I/O pads may be, for example, flat metal contact regions arranged about an outer edge of substrate 106. The set of I/O pads includes input I/O pads 108 and output I/O pads 110. Substrate 106 is housed within a protective semiconductor device package 112 having a set of electrically conductive terminals arranged about an outer surface. The set of terminals may include, for example, "pins" for insertion into holes in a printed circuit board (PCB), or "leads" for attachment to flat metal contact regions on an exposed surface of a PCB. The set of terminals includes input terminals 114 and output terminals 116. Each of the input terminals 114 is electrically connected to a corresponding one of the input I/O pads 108 (e.g., by a bonding wire), and each of the output terminals 116 is electrically connected to a corresponding one of the output I/O pads 110. It is noted that IC 100 may also include other I/O pads and terminals which are used to receive input signals at some times, and to provide output signals at other times.

Input buffer 102 receives an input clock signal CLK via one of the input I/O pads 108, and produces an output clock signal CLK1, wherein output clock signal CLK1 may be considered a "regenerated" version of input clock signal CLK. As described in detail below, input buffer 102 continuously monitors a voltage level VHIGH and a voltage level VLOW of input clock signal CLK, and produces a voltage signal VMID having a voltage substantially mid way between voltage level VHIGH and voltage level VLOW. As described in detail below, voltage signal VMID defines a switching point, and logic level transitions, of input clock signal CLK. Voltage signal VMID acts as a "switching point voltage" within input buffer 102.

Input buffer 102 has a logic high noise margin $NM_H$ existing between the switching point voltage VMID and voltage level VHIGH of the input signal, and a logic low noise margin $NM_L$ existing between switching point voltage VMID and voltage level VLOW of the input signal. As a result of the continuous adjustment of VMID in response to changes in voltage levels VHIGH and/or VLOW, noise margin $NM_H$ and noise margin $NM_L$ of input buffer 102 are maintained substantially equal. This gives input buffer 102 a very high degree of immunity to any noise signal coupled into input clock signal CLK.

In addition, the continuous adjustment of VMID also results in output clock signal CLK1 having a duty cycle which is substantially equal to a duty cycle of input clock signal CLK despite any changes in voltage levels VHIGH and VLOW. Such changes to voltage levels VHIGH and VLOW may occur, for example, as input clock signal CLK traverses a clock distribution network of a synchronous digital logic system on its way to IC 100.

In the embodiment of FIG. 1, circuitry 104 receives output clock signal CLK1 produced by input buffer 102, and other input signals via the other input I/O pads 108. Circuitry 104 produces multiple output signals dependent upon output clock signal CLK1 and one or more of the other input signals, and provides a different one of the output signals to each of the output I/O pads 110. Circuitry 104 may be, for example, synchronous digital logic circuitry. In this situation, reception of the other input signals by circuitry 104 and/or the providing of the output signals may be synchronized with voltage level transitions (i.e., edges) of output clock signal CLK1.

As described above, the continuous adjustment of VMID by input buffer 102 in response to changes in voltage level VHIGH and/or voltage level VLOW also results in output clock signal CLK1 having a duty cycle which is substantially equal to a duty cycle of input clock signal CLK. Output clock signal CLK1 having a duty cycle substantially equal to a duty cycle of input clock signal CLK means that time periods between edge transitions of input clock signal CLK are faithfully reproduced in output clock signal CLK1. Where circuitry 104 is one of several components of a system performing operations synchronized by input clock signal CLK, faithful reproduction of the edge transition times of input clock signal CLK by input buffer 102 helps ensure that circuitry 104 of IC 100 "sees" edges of input clock signal CLK at substantially the same time as the other components.

Circuitry 104 may be, for example, synchronous dynamic random access memory (SDRAM) circuitry. The SDRAM circuitry may include various registers, and the contents of the various registers may control operations performed by the SDRAM circuitry. The SDRAM circuitry may synchronize the reception of the other input signals with voltage level transitions (i.e., edges) of output clock signal CLK1. A portion of the other input signals may represent commands, and the commands may be used to program the registers of the SDRAM circuitry, thus providing programmable operation of the SDRAM circuitry. During memory read operations, the output signals may convey read data, and the SDRAM circuitry may synchronize the providing of the output signals with the edges of output clock signal CLK1. The SDRAM circuitry may include multiple memory arrays forming different memory "banks". The SDRAM circuitry may be operated such that memory accesses are interleaved among the multiple memory banks such that required signal line precharge times within the various memory banks do not impact the performance of the SDRAM circuitry (i.e., are "hidden").

During fabrication of input buffer 102 and circuitry 104, electrically conductive signal lines formed upon substrate 106 may be terminated at corresponding members of the set of I/O pads. Following fabrication of input buffer 102 and circuitry 104, substrate 106 may be secured within package 112, and each of the set of I/O pads may be connected to the corresponding terminal of package 112 (e.g., via a bonding wire).

In other embodiments of IC 100, semiconductor device package 112 may have the set of terminals arranged as an array across an underside surface. For example, in a ball grid array (BGA) embodiment of IC 100, semiconductor device package 112 may include a second substrate made of, for example, fiberglass-epoxy printed circuit board material or a ceramic material (e.g., aluminum oxide, alumina, $Al_2O_3$, or aluminum nitride, AlN). The second substrate may include two sets of bonding pads: a first set formed upon an upper surface and a second set arranged as an array across an underside surface of the device package. The substrate may also include one or more layers of electrically conductive signal lines (i.e., interconnects) used to connect corresponding members of the first and second sets of bonding pads. Substrate 106 may be mounted upon the upper surface of the second substrate, and each of the set of I/O pads of substrate 106 may be electrically connected to corresponding members of the first set of bonding pads of the second substrate (e.g., via a bonding wire). Members of the second set of bonding pads of the second substrate may function as the set of terminals, and may be coated with solder. The resulting solder "balls" extending from the second set of bonding pads may allow IC 100 to be mounted upon a surface of a PCB.

Where input buffer 102 is used throughout a synchronous digital logic system, variations in edge transition times of various versions of a synchronizing clock signal received by components of the system are reduced, thereby allowing the period of the clock signal to be reduced, and the performance of the synchronous digital logic system to be increased.

Figure 2:
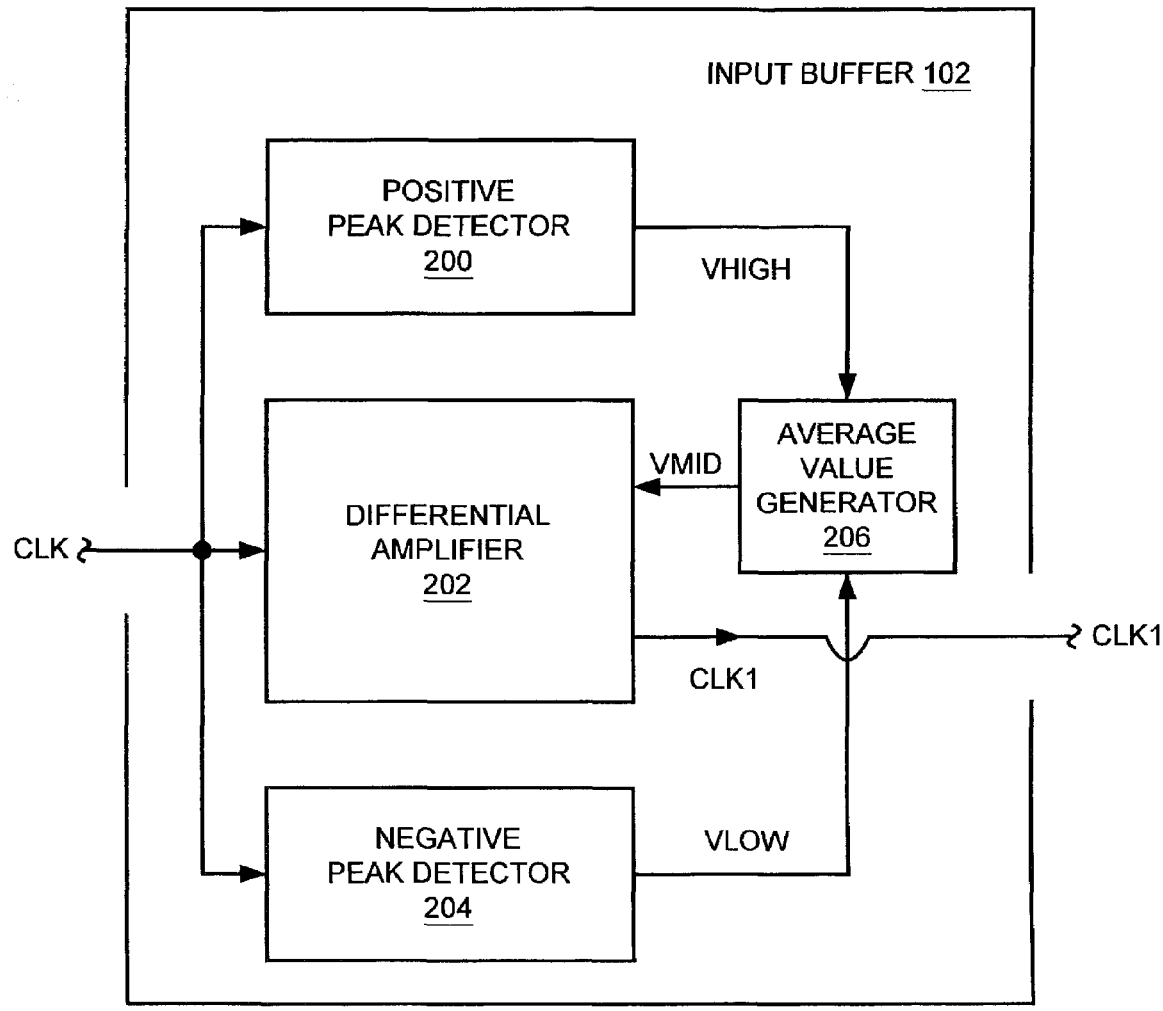
FIG. 2 is a diagram of one embodiment of the input buffer of FIG. 1.

FIG. 2 is a diagram of one embodiment of input buffer 102 of FIG. 1. In the embodiment of FIG. 2, input buffer includes a positive peak detector 200, a differential amplifier 202, a negative peak detector 204, and an average value generator 206. Positive peak detector 200 receives input clock signal CLK, which alternates periodically between a voltage level VHIGH and a voltage level VLOW. For reasons described above, both voltage level VHIGH and voltage level VLOW may vary with time, and may vary from "nominal" or "ideal" values by different amounts at any given time. Positive peak detector 200 produces a voltage signal VHIGH which is substantially equal to voltage level VHIGH of input clock signal CLK. Negative peak detector 204 also receives input clock signal CLK, and produces a voltage signal VLOW which is substantially equal to the voltage level VLOW of input clock signal CLK. Average value generator 206 receives voltage signal VHIGH from positive peak detector 200 and the voltage signal VLOW from negative peak detector 204, and produces a voltage signal VMID, where VMID is substantially the average of voltage signals VHIGH and VLOW. In mathematical terms, VMID≈(VHIGH+VLOW)/2.

Differential amplifier 202 receives input clock signal CLK and voltage signal VMID, and uses input clock signal CLK and voltage signal VMID to produce output clock signal CLK1. In general, differential amplifier 202 performs an analog function, producing output clock signal CLK1 by amplifying a difference in voltage between input clock signal CLK and voltage signal VMID. The operation of differential amplifier 202 may be expressed mathematically as CLK1=k·|(CLK−VMID)|, where CLK is the voltage of input clock signal CLK, CLK1 is the voltage of the output clock signal CLK1, and k is the voltage gain of differential amplifier 202.

Input clock signal CLK typically alternates between one of two logic levels. The voltage of input clock signal CLK is within a first voltage range extending downward from a maximum voltage VMAX when representing one of the logic levels, and is within a second voltage range extending upward from a minimum operating voltage VMIN when representing the other logic level. In the embodiment of FIG. 2, differential amplifier 202 preferably receives electrical power via first and second power supply voltages. The first power supply voltage is more positive than the second, and is preferably substantially equal to VMAX. The second power supply voltage is preferably substantially equal to VMIN. In this situation, positive voltage excursions of output clock signal CLK1 produced by differential amplifier 202 are expectedly limited by the first more positive power supply voltage, and negative voltage excursions of output clock signal CLK1 are expectedly limited by the second power supply voltage. In this way, output clock signal CLK1 produced by differential amplifier 202 may be considered a "regenerated" version of input signal CLK.

The rise and fall times of output clock signal CLK1 depend upon the voltage gain k of differential amplifier 202: the larger the value of k, the shorter the transition times of output signal CLK1. The value of k may thus be varied to achieve acceptable transition time values. It is also noted that voltage gain k can be made either positive or negative, depending on a desired "polarity" of output clock signal CLK1.

The operation of differential amplifier 202 may be likened to that of a comparator. For example, differential amplifier 202 may be said to use VMID as a "switching point" voltage, and to "compare" the voltage of input clock signal CLK to the switching point voltage VMID. If the voltage of input clock signal CLK is greater than the switching point voltage VMID, the input buffer may produce output clock signal CLK1 having a voltage within the first voltage range extending downward from maximum voltage VMAX and representing one of the two logic levels. On the other hand, if the voltage of input clock signal CLK is less than the switching point voltage VMID, differential amplifier 202 may produce output clock signal CLK1 having a voltage within the second voltage range extending upward from minimum voltage VMIN and representing the other of the two logic levels.

As noted above, the continuous adjustment of voltage signal VMID in response to changes in voltage level VHIGH and/or voltage level VLOW allows input buffer 102 to achieve and maintain substantially equal logic high noise margin $NM_H$ and logic low noise margin $NM_L$. This gives input buffer 102 a very high degree of noise immunity. In addition, the continuous adjustment of VMID also results in output clock signal CLK1 having a duty cycle which is substantially equal to a duty cycle of input clock signal CLK despite changes in voltage levels VHIGH and VLOW.

Figure 3A:
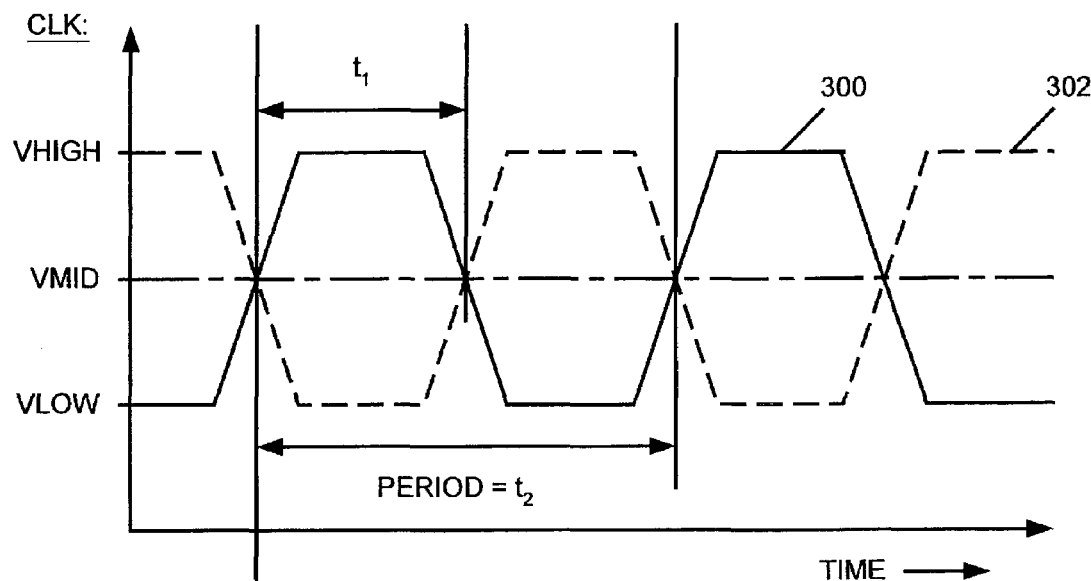
FIG. 3A is a graph of two alternate versions of the input clock signal CLK of FIGS. 1–2 versus time.
Figure 3B:
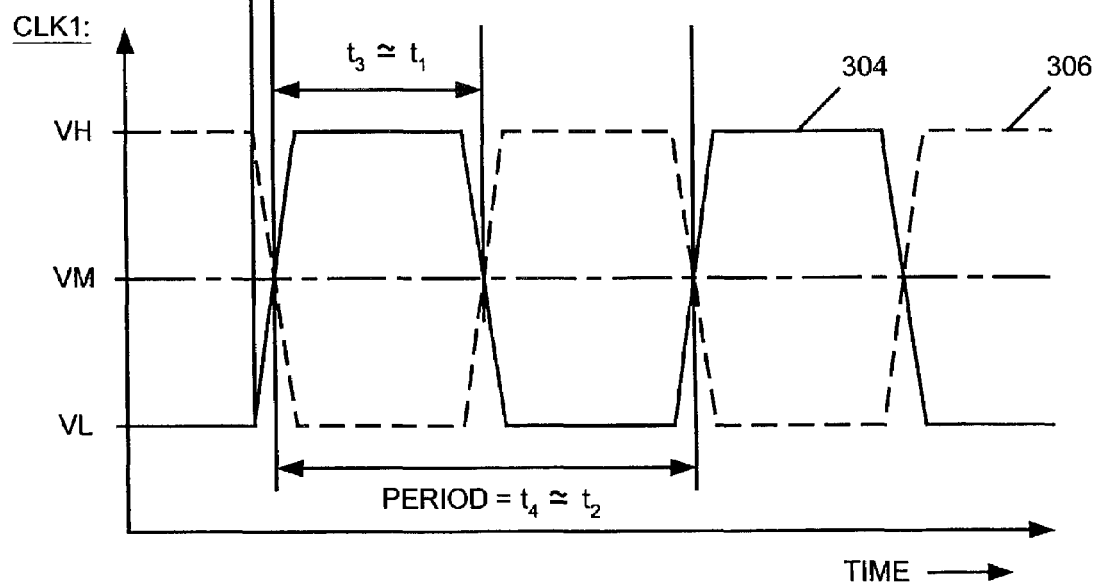
FIG. 3B is a graph of two alternate versions of the output clock signal CLK1 of FIGS. 1–2 versus time.

FIGS. 3A and 3B will now be used to further describe the operation of input buffer 102 of FIGS. 1 and 2. FIG. 3A is a graph of two alternate versions of input clock signal CLK of FIGS. 1–2 versus time. As indicated in FIG. 3A and described above, input clock signal CLK alternates periodically between voltage level VHIGH and voltage level VLOW. For reasons described above, both voltage levels VHIGH and VLOW of input clock signal CLK shown in FIG. 3A may vary with time, and may vary from "nominal" or "ideal" values by different amounts at any given time.

As indicated in FIG. 3A, input clock signal CLK has finite rise and fall times. Average value generator 206 (FIG. 2) produces voltage signal VMID, where VMID is substantially mid way between voltage level VHIGH and voltage level VLOW. In a first version 300 of input clock signal CLK in FIG. 3A, the voltage of input clock signal CLK is equal to voltage level VHIGH during a first portion of each period of the input clock signal CLK, and the voltage of input clock signal CLK is equal to voltage level VLOW during a remainder of each period. Version 300 of input clock signal CLK may be said to be "active high," and to correspond to positive logic.

In a second version 302 of input clock signal CLK in FIG. 3A, the voltage of input clock signal CLK is equal to voltage level VLOW during the first portion of each period of the input clock signal CLK, and the voltage of input clock signal CLK is equal to voltage level VHIGH during the remainder of each period. Version 300 of input clock signal CLK may be said to be "active low," and to correspond to negative logic.

FIG. 3B is a graph of two alternate versions of output clock signal CLK1 of FIGS. 1–2 versus time. As described above, output clock signal CLK1 produced by input buffer 102 may be considered a "regenerated" version of input clock signal CLK. As evident in FIG. 3B, output clock signal CLK1 alternates periodically between a high voltage level VH and low voltage level VL, where VH>VL. A voltage level VM is also shown in FIG. 3B, where VM is substantially mid way between VH and VL. As shown in FIG. 3B, output clock signal CLK1 is delayed from input clock signal CLK by a propagation time "tp."

As described above, both voltage levels VHIGH and VLOW of input clock signal CLK shown in FIG. 3A may vary with time, and may vary from "nominal" or "ideal" values by different amounts at any given time. In "regenerating" input clock signal CLK, input buffer 102 preferably produces output clock signal CLK1 such that voltage levels VH and VL of output clock signal CLK1 are closer to the "nominal" or "ideal" voltage levels.

In a first version 304 of output clock signal CLK1 in FIG. 3B, the voltage of output clock signal CLK1 is equal to voltage level VH during a first portion of each period of the output clock signal CLK1, and the voltage of output clock signal CLK1 is equal to voltage level VL during a remainder of each period. Version 304 of output clock signal CLK1 may be said to be "active high," and to correspond to positive logic.

In a second version 306 of output clock signal CLK1 in FIG. 3B, the voltage of output clock signal CLK1 is equal to voltage level VL during the first portion of each period of the output clock signal CLK1, and the voltage of output clock signal CLK1 is equal to voltage level VH during the remainder of each period. Version 306 of output clock signal CLK1 may be said to be "active low," and to correspond to negative logic.

It is noted that input buffer 102 may produce either first version 304 or second version 306 of output clock signal CLK1 from first version 300 of input clock signal CLK (FIG. 3A). For example, in the embodiment of input buffer 102 of FIG. 2, voltage gain k of differential amplifier 202 may be made positive or negative to produce either first version 304 or second version 306 of output clock signal CLK1. In a similar manner, input buffer 102 can be made to produce either first version 304 or second version 306 of output clock signal CLK1 from second version 302 of input clock signal CLK (FIG. 3A).

Using high gain amplification of the voltage difference between input clock signal CLK and "switching point" voltage signal VMID, input buffer 102 may be able to reduce the transition times of output clock signal CLK1 with respect to those of input clock signal CLK. Such transition time reduction is evident in the faster voltage level transitions of output clock signal CLK1 in FIG. 3B as compared to the slower transitions of input clock signal CLK in FIG. 3A. Voltage signal VMID (FIG. 3A) and voltage level VM (FIG. 3B) are each substantially mid way between the high and low voltage levels of the respective clock signals, and may be used to determine "mid points" of voltage level transitions (i.e., edges) of the respective clock signals. As defined herein, the "period" of a signal alternating between two different voltage levels is defined as a time interval between a mid point of a rising (or falling) edge of the signal and a mid point of the next rising (or falling) edge of the clock signal. The "duty cycle" of the signal is defined herein as a ratio of a time interval between a mid point of a rising (or falling) edge of the signal and a mid point of the next falling (or rising) edge to the period of the signal.

According to the above definitions, input clock signal CLK in FIG. 3A has a period equal to $t_2$ and a duty cycle equal to $(t_1/t_2)$. Output clock signal CLK1 in FIG. 3B has a period $t_4$, where $t_4 \cong t_2$, and a duty cycle of $(t_3/t_4)$, where $t_3 \cong t_1$. Thus the duty cycle of output clock signal CLK1 is substantially equal to the duty cycle of input clock signal CLK. As described above, this result is made possible by the continuous adjustment of voltage signal VMID by input buffer 102 in response to changes in voltage levels VHIGH and VLOW of input clock signal CLK.

Figure 4:
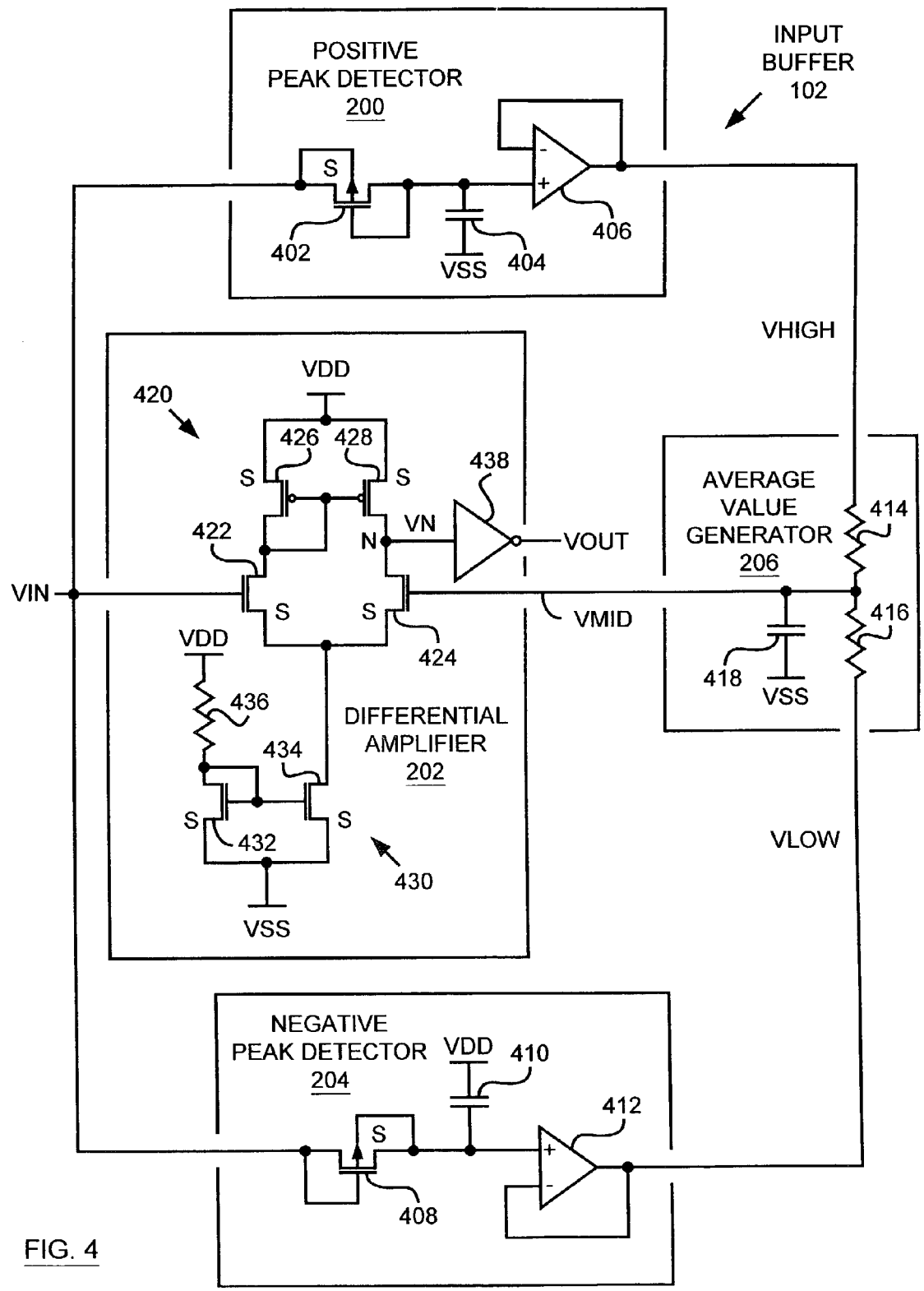
FIG. 4 is a diagram of one embodiment of the input buffer of FIGS. 1–2, and wherein the input buffer receives an input signal VIN (e.g., input clock signal CLK) and produces an output signal VOUT (e.g., output clock signal CLK1)

FIG. 4 is a diagram of one embodiment of input buffer 102 of FIGS. 1–2. In the embodiment of FIG. 4, positive peak detector 200 includes an enhancement mode, p-channel metal oxide semiconductor (pMOS) transistor 402 having a source terminal and a substrate (bulk) electrically connected to one another and to a node receiving input signal VIN (e.g., input clock signal CLK in FIGS. 1 and 2). Input signal VIN alternates between voltage level VHIGH and voltage level VLOW as shown in FIG. 3A. However, input signal VIN may not be periodic, and may not be a synchronizing clock signal. For example, input signal VIN may be a serial data stream which conveys serial data by alternating between voltage levels VHIGH and VLOW. For this reason, the input signal to input buffer 102 will be referred to hereinbelow as input signal VIN.

A gate terminal and a drain terminal of pMOS transistor 402 are connected to one another and to a first terminal of a capacitor 404. A second terminal of capacitor 404 is connected to a power supply voltage VSS which serves as a reference voltage (i.e., a ground voltage). A unity gain buffer 406 has an input terminal connected to the first terminal of capacitor 404, and produces a voltage signal VHIGH at an output terminal.

In the embodiment of FIG. 4, unity gain buffer 406 is an operational amplifier. A positive input terminal of the operational amplifier is the input terminal of unity gain buffer 406, and an output terminal of the operational amplifier is the output terminal of unity gain buffer 406. A negative input terminal of the operational amplifier is connected to the output terminal, providing a feedback path for the operational amplifier. Other embodiments of unity gain buffer 406 are possible and contemplated.

Capacitor 404 has a voltage VC404 between the first and second terminals, with VC404 positive from the first terminal to the second terminal. When VIN>(VC404−VTP), where VTP is a threshold voltage of pMOS transistor 402 and (VTP<0), a channel having a relatively low electrical resistance is formed between the source and drain terminals of pMOS transistor 402. This typically occurs when VIN is the voltage level VHIGH as shown in FIG. 3. An electrical current flows through pMOS transistor 402 and into the first terminal of capacitor 404, charging capacitor 404 and increasing voltage VC404. In general, the voltage at the input terminal of unity gain buffer 406, voltage VC404 of capacitor 404, increases toward a maximum value of (VHIGH+VTP) when VIN is the voltage level VHIGH as shown in FIG. 3. Thus the voltage at the input terminal of unity gain buffer 406 tends to "follow" voltage level VHIGH of input signal VIN, and a final value of voltage signal VHIGH is substantially equal to voltage level VHIGH.

When VIN<(VC404−VTP), the channel does not exist, and the electrical resistance between the source and drain terminals of pMOS transistor 402 is relatively high. This typically occurs when VIN is the voltage level VLOW as shown in FIG. 3. In general, voltage VC404 of capacitor 404, the voltage at the input terminal of unity gain buffer

406, does not change substantially when VIN is the voltage level VLOW as shown in FIG. 3.

In the embodiment of FIG. 4, negative peak detector 204 includes an enhancement mode pMOS transistor 408 having a drain terminal and a gate terminal connected to one another and to the node receiving input signal VIN. A source terminal and a substrate (bulk) of pMOS transistor 408 are electrically connected to one another and to a first terminal of a capacitor 410. A second terminal of capacitor 410 is connected to a power supply voltage VDD, which is greater than power supply voltage VSS. A unity gain buffer 412 has an input terminal connected to the first terminal of capacitor 410, and produces a voltage signal VLOW at an output terminal.

In the embodiment of FIG. 4, unity gain buffer 412 is an operational amplifier. A positive input terminal of the operational amplifier is the input terminal of unity gain buffer 412, and an output terminal of the operational amplifier is the output terminal of unity gain buffer 412. A negative input terminal of the operational amplifier is connected to the output terminal, providing a feedback path for the operational amplifier. Other embodiments of unity gain buffer 412 are possible and contemplated.

Capacitor 410 has a voltage VC410 between the first and second terminals, with VC410 positive from the first terminal to the second terminal. When VIN<(VTP+VC410+VDD), where VTP is the threshold voltage of pMOS transistor 408 and (VTP<0), a channel having a relatively low electrical resistance is formed between the source and drain terminals of pMOS transistor 408. This typically occurs when VIN is the voltage level VLOW as shown in FIG. 3. An electrical current flows through pMOS transistor 408 and out of the first terminal of capacitor 410, charging capacitor 410 and increasing voltage VC410. In general, voltage (VC410+VDD) at the input terminal of unity gain buffer 412 decreases toward a minimum value of (VLOW−VTP) when VIN is the voltage level VLOW as shown in FIG. 3. Thus the voltage at the input terminal of unity gain buffer 412 tends to "follow" voltage level VLOW of input signal VIN, and a final value of voltage signal VLOW is substantially equal to voltage level VLOW.

When VIN>(VTP+VC410+VDD), the channel does not exist, and the electrical resistance between the source and drain terminals of pMOS transistor 408 is relatively high. This typically occurs when VIN is the voltage level VHIGH as shown in FIG. 3. In general, voltage VC410 of capacitor 410, and the voltage at the input terminal of unity gain buffer 412, do not change substantially when VIN is the voltage level VHIGH as shown in FIG. 3.

In the embodiment of FIG. 4, average value generator 206 includes a first resistor 414, a second resistor 416, and a capacitor 418. Resistors 414 and 416 are connected in series between the VHIGH signal produced by positive peak detector 200 and the VLOW signal produced by negative peak detector 204. A voltage signal VMID is produced at a node where resistors 414 and 416 are connected to one another. Resistors 414 and 416 have substantially the same resistance values and form a voltage divider network such that VMID is substantially mid way between, or substantially the average of, VHIGH and VMID. Mathematically, VMID≈(VHIGH+VLOW)/2. A first terminal of capacitor 418 is connected to the node between resistors 414 and 416, and a second terminal of capacitor 418 is connected to power supply voltage VSS. Capacitor 418 is used to "smooth" transitions in VMID when VHIGH and/or VLOW change.

Differential amplifier 202 includes a differential network 420. Differential network 420 includes two enhancement mode, n-channel metal oxide semiconductor (nMOS) driver transistors 422 and 424 having source terminals connected together at a node to form a "source-coupled pair." Each nMOS driver transistor 422 and 424 has a corresponding pMOS transistor acting as an active load. An enhancement mode pMOS transistor 426 connected in series with nMOS driver transistor 422 forms an active load for nMOS driver transistor 422, and an enhancement mode pMOS transistor 428 connected in series with nMOS driver transistor 424 forms an active load for nMOS driver transistor 428. Aspect ratios of nMOS driver transistors 422 and 424 are preferably substantially the same (i.e., nMOS transistors 422 and 424 are preferably "matched" transistors).

The pMOS load transistors 426 and 428 are connected together to form a current mirror. Source terminals of pMOS transistors 426 and 428 are connected to power supply voltage VDD. A gate terminal of pMOS transistor 426 is connected to a drain terminal of pMOS transistor 426 and to a gate terminal of pMOS transistor 428 such that a current flowing from source-to-drain through pMOS transistor 428 is directly proportional to a current flowing from source-to-drain through pMOS transistor 426. Aspect ratios of pMOS transistors 426 and 428 are preferably substantially the same (i.e., pMOS transistors 426 and 428 are preferably "matched") such that currents flowing through pMOS transistors 426 and 428 are substantially equal.

Differential network 420 also includes a constant current sink 430 which draws a substantially constant current out of the node where the source terminals of nMOS drive transistors 422 and 424 are connected together. Constant current sink 430 includes enhancement mode nMOS transistors 432 and 434 connected together to form a current mirror. Source terminals of nMOS transistors 432 and 434 are connected to power supply voltage VSS. A gate terminal of nMOS transistor 432 is connected to a drain terminal of nMOS transistor 432 and to a gate terminal of nMOS transistor 434 such that a current flowing from drain-to-source through nMOS transistor 434 is directly proportional to a current flowing from drain-to-source through nMOS transistor 432. A resistor 436 connected between power supply voltage VDD and the drain terminal of nMOS transistor 432 determines the drain-to-source current through nMOS transistor 432. Aspect ratios of nMOS transistors 432 and 434 may be made substantially the same (i.e., nMOS transistors 432 and 434 may be "matched") such that currents flowing through pMOS transistors 426 and 428 are substantially equal.

A gate terminal of nMOS driver transistor 422 is connected to the node receiving input signal VIN, and a gate terminal of nMOS driver transistor 424 is connected to the node of average value generator 206 where resistors 414 and 416 are connected to one another, and receives voltage signal VMID. At a node N where the drain terminal of nMOS driver 424 is connected to the drain terminal of pMOS load transistor 428, a voltage signal VN is produced which is the amplified difference between input signal VIN and voltage signal VMID. Mathematically, VN=k·(VIN−VMID) where k is a voltage gain of differential network 420. It is noted that in the embodiment of FIG. 4, voltage gain k is positive and much greater than 1.

In the embodiment of FIG. 4, differential amplifier 202 also includes an inverter 438 having an input terminal connected to node N and an output terminal producing an output signal VOUT (e.g., output clock signal CLK1). Inverter 438 may be, for example, a complementary metal oxide semiconductor (CMOS) inverter including an enhancement mode pMOS transistor and an enhancement mode nMOS transistor connected in series between power supply voltages VDD and VSS. In such a CMOS inverter, gate terminals of the nMOS and pMOS transistors receive voltage signal VN. Inverter 438 preferably has a switching point substantially equal to VDD/2.

The operation of differential amplifier 202 may be likened to that of a comparator. For example, differential amplifier 202 may be said to use voltage signal VMID as a "switching point" voltage, and to "compare" input signal VIN to the switching point voltage VMID. In the embodiment of FIG. 4, if VIN is greater than the switching point voltage VMID, differential amplifier 202 produces output signal VOUT within a "low" voltage range extending upward from reference power supply voltage VSS and representing one of two logic levels (e.g., a logic 0). On the other hand, if VIN is less than the switching point voltage VMID, differential amplifier 202 produces output signal VOUT within a "high" voltage range extending downward from power supply voltage VDD and representing the other of the two logic levels (e.g., a logic 1).

For simplicity, the substrate (bulk) connections of the MOS transistors making up differential amplifier 202 have not been shown in FIG. 4, and the MOS transistor symbols used in differential amplifier 202 reflect this fact. The substrates (bulks) of all nMOS transistors of differential amplifier 202 are connected to power supply voltage VSS, and the substrates (bulks) of all pMOS transistors of differential amplifier 202 are connected to power supply voltage VDD.

It is noted that as voltage gain k of differential network 420 is positive and inverter 438 inverts signal VN, output signal VOUT is inverted with respect to input signal VIN. It is also noted that in other embodiments of differential amplifier 202, differential network 420 can be configured such that voltage gain k of differential network 420 is made negative, thus changing the polarity of output signal VOUT such that output signal VOUT is in phase with input signal VIN.

As noted above, the continuous adjustment of voltage signal VMID in response to changes in VHIGH and/or VLOW allows input buffer 102 to achieve and maintain substantially equal logic high noise margin $NM_H$ and logic low noise margin $NM_L$. This gives input buffer 102 a very high degree of noise immunity. In addition, where input signal VIN is a periodic clock signal (e.g., input clock signal CLK) and output signal VOUT is a "regenerated" version of that periodic clock signal (e.g., output clock signal CLK1), the continuous adjustment of voltage signal VMID results in output signal VOUT (CLK1) having a duty cycle which is substantially equal to a duty cycle of input signal VIN (CLK) despite changes in voltage levels VHIGH and VLOW of input signal VIN.

Figure 5:
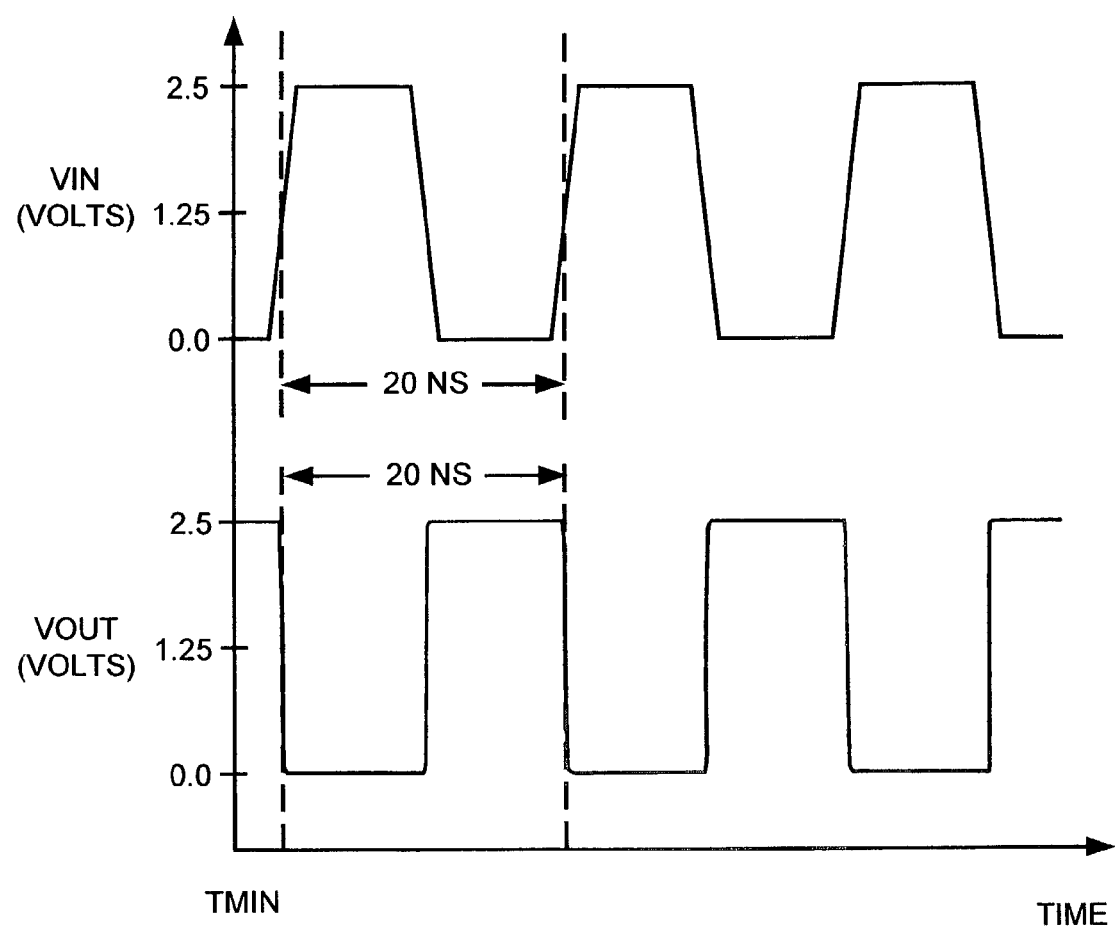
FIG. 5 is a graph of input signal VIN and output signal VOUT for the input buffer of FIG. 4 versus time for time $\geq$ TMIN, where input signal VIN alternates periodically between 0.0 volts (a power supply voltage VSS) and 2.5 volts (a power supply voltage VDD), and TMIN is the time at which voltage signal VMID reaches a final value.

FIG. 5 is a graph of input signal VIN and output signal VOUT for input buffer 102 of FIG. 4 versus time for time≧TMIN, where input signal VIN alternates periodically between 0.0 volts (VSS) and 2.5 volts (VDD), and TMIN is the time at which voltage signal VMID reaches a final value. Input signal VIN may be, for example, a synchronizing clock signal. As shown in FIG. 5 and defined above, the period of input signal VIN is 20 nanoseconds, corresponding to a frequency of 50 MHz. Input signal VIN has rise and fall times of 2 nanoseconds, resulting in a trapezoidal waveform. The duty cycle of input signal VIN as defined above is about 50 percent.

As shown in FIG. 5, output signal VOUT also alternates periodically between 0.0 volts (VSS) and 2.5 volts (VDD), and is inverted with respect to input signal VIN. Like input signal VIN, output signal VOUT also has a period of about 20 nanoseconds as defined above, corresponding to a frequency of 50 MHz. Output signal VOUT has rise and fall times much less than the 2 nanosecond rise and fall times of input signal VIN. As a result, output signal VOUT more closely resembles a square wave than input signal VIN. The duty cycle of output signal VOUT as defined above is also about 50 percent.

It is noted that capacitor voltages VC404 and VC410 across respective capacitors 404 and 410 in FIG. 4 are zero at time=0, and input signal VIN is applied to input buffer 102 at time=0. Voltage signal VMID produced by average value generator 206 (FIG. 4) is substantially equal to VDD/2, or 1.25 volts, at time=0. Voltage signal VHIGH produced by positive peak detector 200 (FIG. 4) increases from 0.0 volts toward a final value of (2.5 volts+VTP) where (VTP<0), and voltage signal VLOW produced by negative peak detector 204 decreases from 2.5 volts toward a final value of (0.0 volts−VTP).

The rate at which voltage signal VHIGH increases may be different than the rate at which voltage signal VLOW decreases. In this situation, voltage signal VMID may be greater than or less than the final value of VDD/2 (1.25 volts) between time=0 and time=TMIN. By time=TMIN, VMID has reached (i.e., returned to) the final value, and remains substantially the final value for time≧TMIN. In this situation, TMIN≧0 (e.g., a few hundred nanoseconds). Alternately, the rate at which voltage signal VHIGH increases may be substantially equal to the rate at which voltage signal VLOW decreases such that VMID remains substantially equal to the final value of VDD/2 (1.25 volts) for all time≧0. In this situation, TMIN=0.

Figure 6:
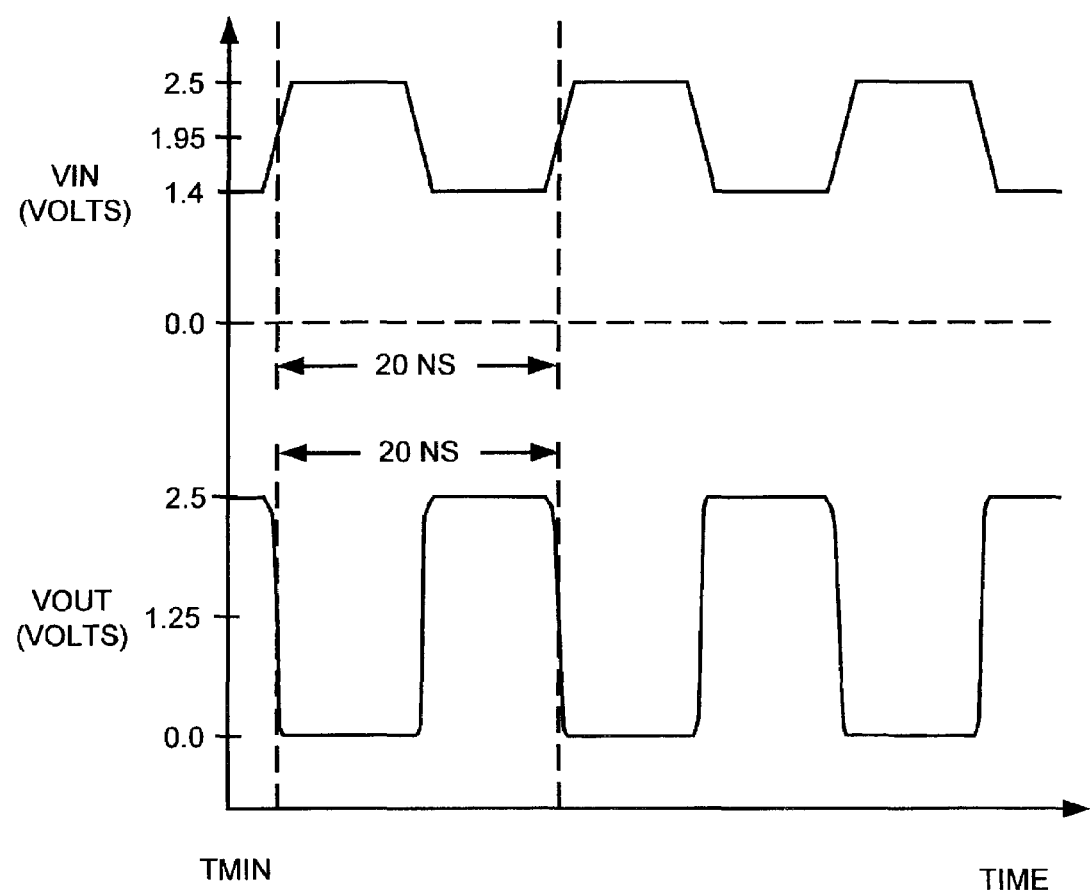
FIG. 6 is a graph of input signal VIN and output signal VOUT for the input buffer of FIG. 4 versus time for time $\geq$ TMIN, where input signal VIN alternates periodically between 1.4 volts and 2.5 volts (VDD), and TMIN is the time at which voltage signal VMID reaches a final value.

FIG. 6 is a graph of input signal VIN and output signal VOUT for input buffer 102 of FIG. 4 versus time for time≧TMIN, where input signal VIN alternates periodically between 1.4 volts and 2.5 volts (VDD), and TMIN is the time at which voltage signal VMID reaches a final value. Power supply voltage VSS is 0.0 volts. As shown in FIG. 5 and defined above, the period of input signal VIN is 20 nanoseconds, corresponding to a frequency of 50 MHz. Input signal VIN has rise and fall times of 2 nanoseconds, resulting in a trapezoidal waveform. The duty cycle of input signal VIN as defined above is about 50 percent.

As shown in FIG. 6, output signal VOUT alternates periodically between 0.0 volts (VSS) and 2.5 volts (VDD), despite that fact that input signal VIN does not. Output signal VOUT is inverted with respect to input signal VIN as noted above. Like input signal VIN, output signal VOUT has a period of about 20 nanoseconds as defined above, corresponding to a frequency of 50 MHz. Output signal VOUT has rise and fall times much less than the 2 nanosecond rise and fall times of input signal VIN. As a result, output signal VOUT more closely resembles a square wave than input signal VIN. The duty cycle of output signal VOUT as defined above is about 49 percent, substantially the 50 percent duty cycle of input signal VIN.

Again, capacitor voltages VC404 and VC410 across respective capacitors 404 and 410 in FIG. 4 are zero at time=0, and input signal VIN is applied to input buffer 102 at time=0. Voltage signal VMID produced by average value generator 206 (FIG. 4) is substantially equal to VDD/2, or 1.25 volts, at time=0. Voltage signal VHIGH produced by positive peak detector 200 (FIG. 4) increases from 0.0 volts toward a final value of (2.5 volts+VTP) where (VTP<0), and voltage signal VLOW produced by negative peak detector 204 decreases from 2.5 volts toward a final value of (1.4 volts−VTP). The rate at which voltage signal VHIGH increases is greater than the rate at which voltage signal VLOW decreases, and voltage signal VMID increases from 1.25 volts toward a final value (e.g., 1.95 volts). Voltage signal VMID reaches the final value at time=TMIN (e.g., a few hundred nanoseconds), and VMID is substantially equal to the final value for time≧TMIN.

Figure 7:
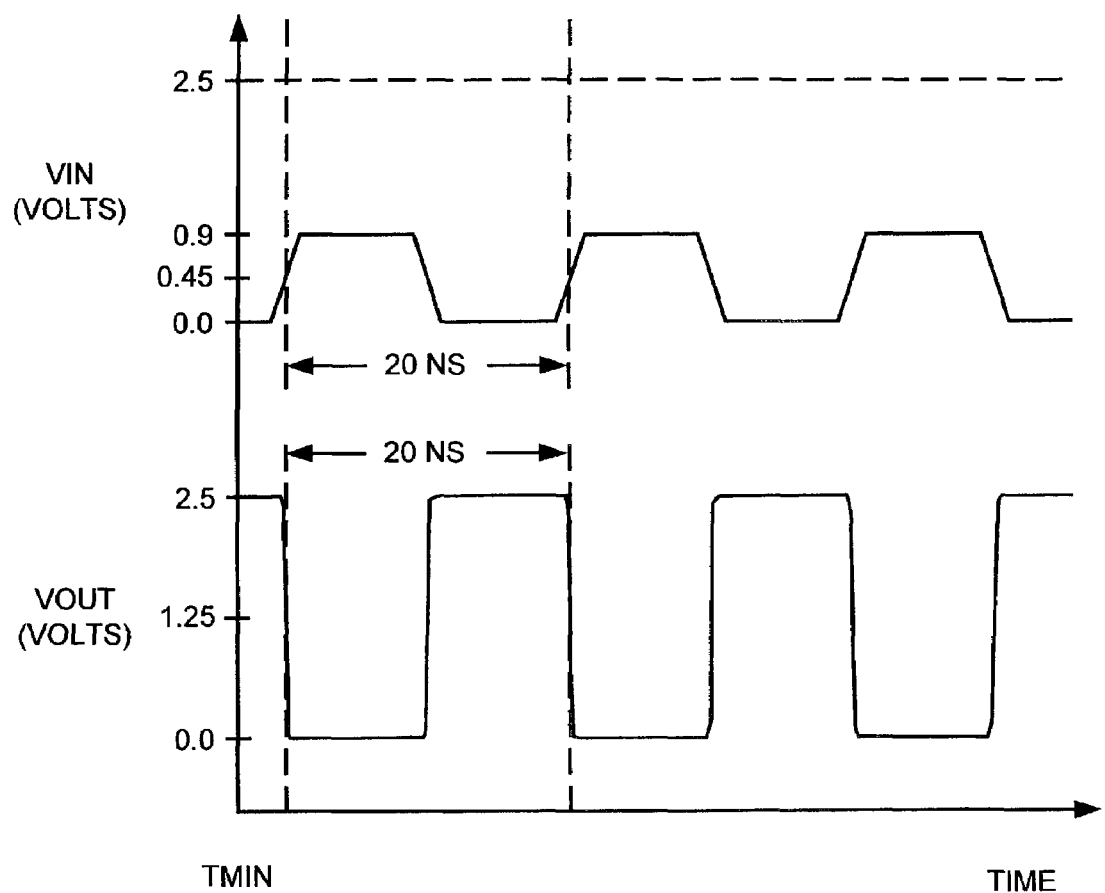
FIG. 7 is a graph of input signal VIN and output signal VOUT for the input buffer of FIG. 4 versus time for time $\geq$ TMIN, where input signal VIN alternates periodically between 0.0 volts (VSS) and 0.9 volts, and TMIN is the time at which voltage signal VMID reaches a final value.

FIG. 7 is a graph of input signal VIN and output signal VOUT for input buffer 102 of FIG. 4 versus time for time≧TMIN, where input signal VIN alternates periodically between 0.0 volts (VSS) and 0.9 volts, and TMIN is the time at which voltage signal VMID reaches a final value. Power supply voltage VDD is 2.5 volts. As shown in FIG. 5 and defined above, the period of input signal VIN is 20 nanoseconds, corresponding to a frequency of 50 MHz. Input signal VIN has rise and fall times of 2 nanoseconds, resulting in a trapezoidal waveform. The duty cycle of input signal VIN as defined above is about 50 percent.

As shown in FIG. 7, output signal VOUT alternates periodically between 0.0 volts (VSS) and 2.5 volts (VDD), despite that fact that input signal VIN does not. Output signal VOUT is inverted with respect to input signal VIN as noted above. Like input signal VIN, output signal VOUT has a period of about 20 nanoseconds as defined above, corresponding to a frequency of 50 MHz. Output signal VOUT has rise and fall times much less than the 2 nanosecond rise and fall times of input signal VIN. As a result, output signal VOUT more closely resembles a square wave than input signal VIN. The duty cycle of output signal VOUT as defined above is about 50 percent, the same as the duty cycle of input signal VIN.

Again, capacitor voltages VC404 and VC410 across respective capacitors 404 and 410 in FIG. 4 are zero at time=0, and input signal VIN is applied to input buffer 102 at time=0. Voltage signal VMID produced by average value generator 206 (FIG. 4) is substantially equal to VDD/2, or 1.25 volts, at time=0. Voltage signal VHIGH produced by positive peak detector 200 (FIG. 4) increases from 0.0 volts toward a final value of (0.9 volts+VTP) where (VTP<0), and voltage signal VLOW produced by negative peak detector 204 decreases from 2.5 volts toward a final value of (0.0 volts−VTP). The rate at which voltage signal VHIGH increases is less than the rate at which voltage signal VLOW decreases, and voltage signal VMID decreases from 1.25 volts toward a final value (e.g., 0.48 volts). Voltage signal VMID reaches the final value at time=TMIN (e.g., a few hundred nanoseconds), and VMID is substantially equal to the final value for time≧TMIN.

Figure 8:
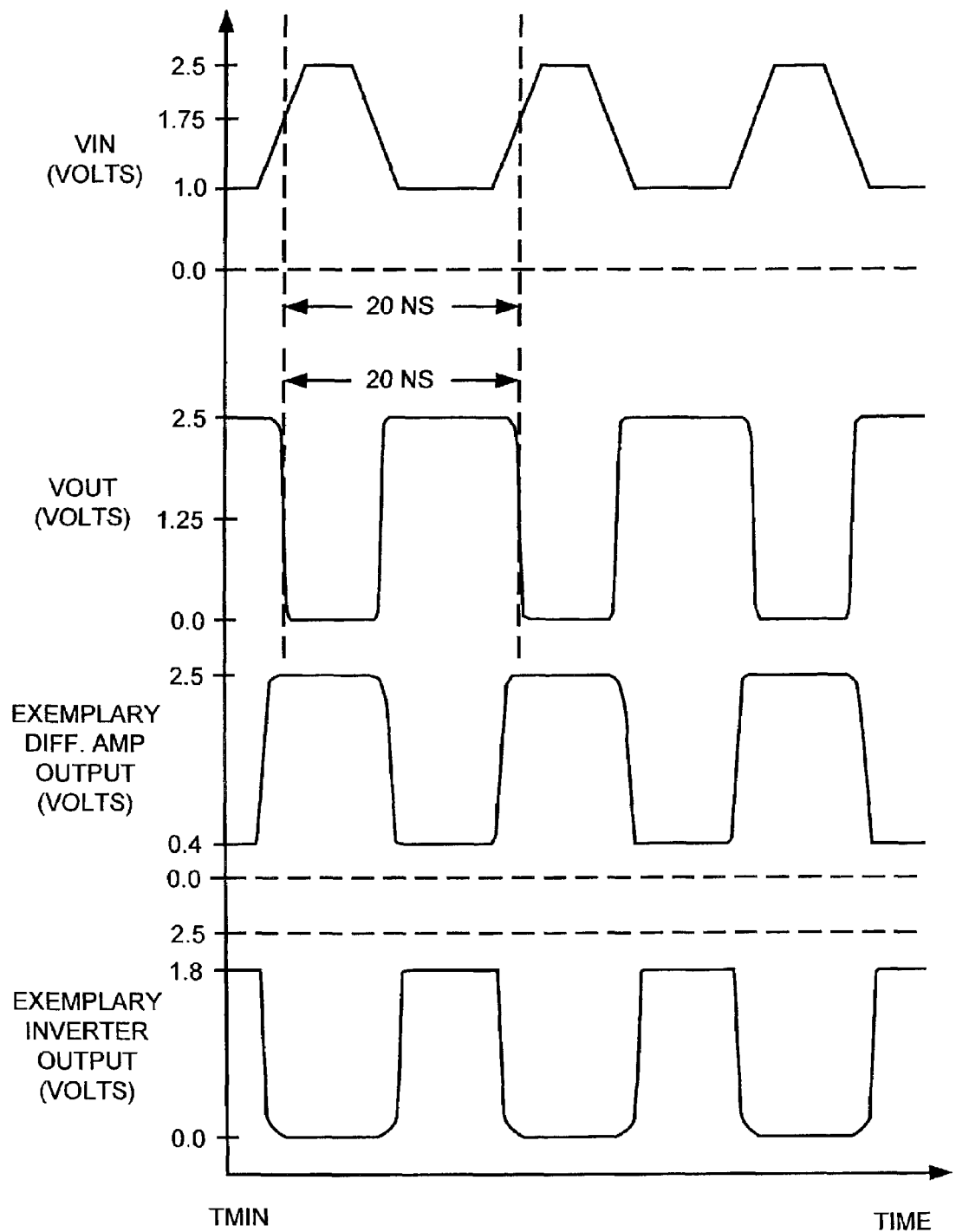
FIG. 8 is a graph of input signal VIN and output signal VOUT for the input buffer of FIG. 4, as well as outputs of an exemplary differential amplifier and an exemplary inverter receiving input signal VIN, versus time for time $\geq$ TMIN, where input signal VIN alternates periodically between 1.0 volts and 2.5 volts (VDD), and TMIN is the time at which voltage signal VMID reaches a final value.

FIG. 8 is a graph of input signal VIN and output signal VOUT for input buffer 102 of FIG. 4, as well as outputs of an exemplary differential amplifier and an exemplary inverter receiving input signal VIN, versus time for time≧TMIN, where input signal VIN alternates periodically between 1.0 volts and 2.5 volts (VDD), and TMIN is the time at which voltage signal VMID reaches a final value. Power supply voltage VSS is 0.0 volts. As shown in FIG. 8 and defined above, the period of input signal VIN is 20 nanoseconds, corresponding to a frequency of 50 MHz. Input signal VIN has rise and fall times of 4 nanoseconds, resulting in a markedly trapezoidal waveform. The duty cycle of input signal VIN as defined above is about 42 percent.

The exemplary differential amplifier is similar to differential network 420 shown in FIG. 4 and described above. A gate terminal of an nMOS driver transistor corresponding to nMOS driver transistor 422 of FIG. 4 receives input signal VIN, and a gate terminal of an nMOS driver transistor corresponding to nMOS driver transistor 424 is connected to a 1.25 volt reference voltage. The switching point of the exemplary differential amplifier is thus 1.25 volts. The output signal of the exemplary differential amplifier is sampled at the node corresponding to node N of FIG. 4 where voltage signal VN is produced. Mathematically, the output signal voltage of the exemplary differential amplifier is k·(VIN−1.25 volts) where k is the voltage gain of the exemplary differential amplifier, and k is positive and much greater than 1.

The exemplary inverter is a CMOS inverter including an enhancement mode pMOS transistor and an enhancement mode nMOS transistor connected in series between power supply voltages VDD and VSS. Gate terminals of the nMOS and pMOS transistors receive input signal VIN. The exemplary inverter has a switching point of 1.20 volts.

As shown in FIG. 8, output signal VOUT produced by input buffer 102 alternates periodically between 0.0 volts (VSS) and 2.5 volts (VDD), despite the fact that input signal VIN does not. Output signal VOUT is inverted with respect to input signal VIN as noted above. Like input signal VIN, output signal VOUT has a period of about 20 nanoseconds as defined above, corresponding to a frequency of 50 MHz. Output signal VOUT has rise and fall times much less than the 4 nanosecond rise and fall times of input signal VIN. As a result, output signal VOUT more closely resembles a square wave than input signal VIN. The duty cycle of output signal VOUT as defined above is about 42 percent, the same as the duty cycle of input signal VIN.

Again, capacitor voltages VC404 and VC410 across respective capacitors 404 and 410 in FIG. 4 are zero at time=0, and input signal VIN is applied to input buffer 102 at time=0. Voltage signal VMID produced by average value generator 206 (FIG. 4) is substantially equal to VDD/2, or 1.25 volts, at time=0. Voltage signal VHIGH produced by positive peak detector 200 (FIG. 4) increases from 0.0 volts toward a final value of (2.5 volts+VTP) where (VTP<0), and voltage signal VLOW produced by negative peak detector 204 decreases from 2.5 volts toward a final value of (1.0 volts−VTP). The rate at which voltage signal VHIGH increases is greater than the rate at which voltage signal VLOW decreases, and voltage signal VMID increases from 1.25 volts toward a final value (e.g., 1.74 volts). Voltage signal VMID reaches the final value at time=TMIN (e.g., a few hundred nanoseconds), and VMID is substantially equal to the final value for time≧TMIN.

The output of the exemplary differential amplifier alternates periodically between about 0.4 volts and 2.5 volts as indicted in FIG. 8. The output of the exemplary differential amplifier is in phase with input signal VIN. Like input signal VIN, the output of the exemplary differential amplifier has a period of about 20 nanoseconds as defined above, corresponding to a frequency of 50 MHz. The output of the exemplary differential amplifier has rise and fall times much less than the 4 nanosecond rise and fall times of input signal VIN, and more closely resembles a square wave than input signal VIN. The duty cycle of the output of the exemplary differential amplifier output signal VOUT as defined above is about 54 percent, which differs markedly from the 42 percent duty cycle of input signal VIN.

The output of the exemplary inverter alternates periodically between 0.0 volts and about 1.8 volts as indicated in FIG. 8. Like output signal VOUT of input buffer 102, the output of the exemplary inverter is inverted with respect to input signal VIN. Like input signal VIN, the output of the exemplary inverter has a period of about 20 nanoseconds as defined above, corresponding to a frequency of 50 MHz. The output of the exemplary inverter has rise and fall times much less than the 4 nanosecond rise and fall times of input signal VIN, and more closely resembles a square wave than input signal VIN. The duty cycle of the output of the exemplary inverter as defined above is about 58 percent, which differs markedly from the 42 percent duty cycle of input signal VIN.

FIG. 8 serves to illustrate that where input signal VIN is a periodic clock signal (e.g., input clock signal CLK) and output signal VOUT is a "regenerated" version of that periodic clock signal (e.g., output clock signal CLK1), the continuous adjustment of voltage signal VMID results in output signal VOUT (CLK1) having a duty cycle which is substantially equal to a duty cycle of input signal VIN (CLK) despite changes in voltage levels VHIGH and VLOW of input signal VIN. It is also noted that the continuous adjustment of VMID in response to changes in voltage levels VHIGH and/or VLOW of input signal VIN allows input buffer 102 to achieve and maintain substantially equal logic high noise margin $NM_H$ and logic low noise margin $NM_L$. This gives input buffer 102 a very high degree of noise immunity.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus comprising:
a detector circuit adapted to receive an input signal, wherein a voltage magnitude of the input signal alternates between a first voltage level and a second voltage level, and wherein the detector circuit is configured to produce a first signal having a magnitude indicative of the first voltage level and a second signal having a magnitude indicative of the second voltage level; and
an average generator circuit adapted to receive the first and second signals and configured to use the magnitudes of the first and second signals to produce a third signal having a magnitude indicative of a third voltage level substantially mid way between the first voltage level and the second voltage level, wherein the third voltage level defines a switching point, and wherein a first noise margin exists between the switching point and the first voltage level of the input signal, and wherein a second noise margin exists between the switching point and the second voltage level of the input signal, and wherein the switching point varies with changes in the first and second voltage levels of the input signal such that the first and second noise margins are maintained substantially equal.

2. The apparatus as recited in claim 1, wherein the input signal alternates between the first voltage level and the second voltage level periodically and has a period and a duty cycle.

3. The apparatus as recited in claim 1, wherein the first voltage level is greater than the second voltage level.

4. The apparatus as recited in claim 1, wherein the first signal is substantially equal to the first voltage level.

5. The apparatus as recited in claim 1, wherein the second signal is substantially equal to the second voltage level.

6. The apparatus as recited in claim 1, wherein the third voltage signal is substantially equal to the third voltage level.

7. The apparatus as recited in claim 1, wherein the detector circuit comprises a first detector circuit configured to produce the first signal and a second detector circuit configured to produce the second signal.

8. The apparatus of claim 7, wherein the first detector circuit is configured to produce the first signal having the magnitude substantially equal to the first voltage level, and wherein the second detector circuit is configured to produce the second signal having the magnitude substantially equal to the second voltage level.

9. The apparatus as recited in claim 1, wherein the average generator circuit comprises a pair of resistors connected in series between the first and second signals, and wherein the third signal is produced at a connection point between the pair of resistors, and wherein the pair of resistors have substantially equal resistance values such that the third signal is substantially mid way between the first voltage level and the second voltage level.

10. The apparatus as recited in claim 1, further comprising a differential amplifier adapted to receive the input signal, the third signal, a first power supply voltage, and a second power supply voltage, wherein the differential amplifier is configured to amplify a difference between the magnitude of the input signal and the third voltage level in order to produce an output signal which alternates between the first and second power supply voltages.

11. The apparatus of claim 10, wherein the first power supply voltage is greater than or equal to the first voltage level, and wherein the second power supply voltage is less than or equal to the second voltage level.

12. The apparatus of claim 10, wherein the differential amplifier is configured to amplify the difference between the voltage magnitude of the input signal and the third voltage level to vary a rise time and a fall time of the output signal.

13. The apparatus as recited in claim 12, wherein the output signal alternates between the first and second power supply voltages periodically and has a period substantially equal to a period of the input signal and a duty cycle substantially equal to a duty cycle of the input signal.

14. The apparatus as recited in claim 12, wherein the differential amplifier comprises a plurality of metal oxide semiconductor (MOS) transistors, connected together to form a differential network, and an inverter, and wherein the differential network is coupled to receive the input signal and the third signal and configured to amplify the difference between the magnitudes of the input signal and the third signal to produce an intermediate signal, and wherein the inverter is coupled to receive the intermediate signal at an input terminal and the first and second power supply voltages, and wherein the inverter is configured to produce the output signal at an output terminal, and wherein the output signal alternates between the first and second power supply voltages.

15. An apparatus comprising:
a detector circuit adapted to receive an input signal, wherein a voltage magnitude of the input signal alternates between a first voltage level and a second voltage level and wherein the detector circuit is configured to produce a first signal having a magnitude indicative of the first voltage level and a second signal having a magnitude indicative of the second voltage level, wherein the detector circuit comprises a first detector circuit configured to produce the first signal and a second detector circuit configured to produce the second signal, and wherein the first detector circuit is configured to produce the first signal having the magnitude substantially equal to the first voltage level, and wherein the second detector circuit is configured to produce the second signal having the magnitude substantially equal to the second voltage level; and an average generator circuit adapted to receive the first and second signals and configured use the magnitudes of the first and second signals to produce a third signal having a magnitude indicative of a third voltage level substantially mid way between the first voltage level and the second voltage level, wherein the first detector circuit comprises a p-channel metal oxide semiconductor (pMOS) transistor and a capacitor, and wherein a source terminal of the pMOS transistor is coupled to receive the input signal, and wherein the capacitor is coupled between a drain terminal of the pMOS transistor and the second power supply voltage, and wherein electrical current flows through the pMOS transistor and charges the capacitor when the voltage magnitude of the input signal is the first voltage level and a voltage across the capacitor is substantially less that the first voltage level.

16. An apparatus, comprising:

a detect circuit adapted to receive an input signal, wherein a voltage magnitude of the input signal alternates between a first voltage level and a second voltage level, and wherein the detector circuit is configured to produce a first signal having a magnitude indicative of the first voltage level and a second signal having a magnitude indicative of the second voltage level, wherein the detector circuit comprises a first detector circuit configured to produce the first signal and a second detector circuit configured to produce the second signal, and wherein the first detector circuit is configured to produce the first signal having the magnitude substantially equal to the first voltage level, and wherein the second detector circuit is configured to produce the second signal having the magnitude substantially equal to the second voltage level; and an average generator circuit adapted to receive the first and second signals and configured to use the magnitudes of the first and second signals to produce a third signal having a magnitude indicative of a third voltage level substantially mid way between the first voltage level and the second voltage level, wherein the second detector circuit comprises a p-channel metal oxide semiconductor (pMOS) transistor and a capacitor, and wherein a drain terminal of the pMOS transistor is coupled to receive the input signal, and wherein the capacitor is coupled between a source terminal of the pMOS transistor and the first power supply voltage, and wherein electrical current flows through the pMOS transistor and charges the capacitor when the voltage magnitude of the input signal is the second voltage level and a voltage between the source terminal and the second power supply voltage is substantially greater than the second voltage level.

17. A circuit, comprising:

an input/output pad adapted to receive an input signal, wherein a voltage magnitude of the input signal alternates between a first voltage level and a second voltage level;

input buffer, comprising:

a first detector circuit coupled to the input/output pad and configured to produce a first signal having a magnitude indicative of the first voltage level of the input signal;

a second detector circuit coupled to the input/output pad and configured to produce a second signal having a magnitude indicative of the second voltage level of the input signal;

an average generator circuit coupled to receive the first and second signals and configured to use the magnitudes of the first and second signals to produce a third signal having a magnitude indicative of a third voltage level substantially mid way between the first voltage level and the second voltage level; and circuitry coupled to receive the third signal and configured to perform a function dependent upon the third signal, wherein the circuitry comprises a differential amplifier coupled to the input/output pad and coupled to receive the third signal, a first power supply voltage, and a second power supply voltage, wherein the differential amplifier is configured to amplify a difference between the voltage magnitude of the input signal and the third voltage level in order to produce an output signal which alternates between the first and second power supply voltages.

18. The circuit as recited in claim 17, wherein the input signal is a first serial data stream, and the output signal is a second serial data stream.

19. The circuit as recited in claim 18, wherein the input signal is a first clock signal, and the output signal is a second clock signal.

20. The circuit as recited in claim 17, wherein said circuitry further comprises synchronous dynamic random access memory (SDRAM) circuitry, and wherein the SDRAM circuitry uses the second clock signal to synchronize internal operations.

21. A method for signal buffering, comprising:

receiving an input signal, wherein a voltage magnitude of the input signal alternates between a first voltage level and second voltage level;

producing a first signal having a magnitude indicative of the first voltage level of the input signal;

producing a second signal having a magnitude indicative of the second voltage level of the input signal; and producing a third signal using the first second signals, wherein the third signal has a magnitude indicative of a third voltage level substantially mid way between the first voltage level and the second voltage level of the input signal, where producing the third signal comprises defining a switching point such that a first noise margin exists between the switching point and the first voltage level and a second noise margin exists between the switching point and the second voltage level.

22. The method of claim 21, wherein defining the switching point comprises varying the switching point in response to changes in the first and second voltage levels such that the first and second noise margins are maintained substantially equal.

23. The method of claim 21, further comprising amplifying a difference between the voltage magnitude of the input signal and the third voltage level to produce an output signal which alternates between a first power supply voltage and a second power supply voltage.

24. The apparatus of claim 23, wherein amplifying the difference between the voltage magnitude of the input signal and the third voltage level to produce the output signal which alternates between the first power supply voltage and the second power supply voltage comprises amplifying the first voltage level that is less than or equal to the first power supply voltage.

25. The apparatus of claim 24, wherein amplifying the difference between the voltage magnitude of the input signal and the third voltage level to produce the output signal which alternates between the first power supply voltage and the second power supply voltage comprises amplifying the second voltage level that is greater than or equal to the second power supply voltage.

26. The method of claim 24, wherein amplifying the difference between the voltage magnitude of the input signal and the third voltage level to produce the output signal comprises amplifying a difference between the voltage magnitude of an input clock signal and the third voltage level to produce an output clock signal.

27. The method of claim 24, wherein amplifying the difference between the voltage magnitude of the input signal and the third voltage level to produce the output signal comprises amplifying a difference between the voltage magnitude of an input serial data stream and the third voltage level to produce an output serial data stream.

28. The method of claim 24, wherein amplifying the difference between the voltage magnitude of the input signal and the third voltage level to produce the output signal comprises amplifying the difference between the voltage magnitude of the input signal and the third voltage level to produce the output signal having a rise time and a fall time that differ from a rise rime and a fall time of the input signal.

29. The method of claim 24, further comprising providing the output signal to a circuit.

30. The method of claim 29, wherein providing the output signal to the circuit comprises providing the output signal to an SDRAM memory.

* * * * *

UNITED STATES PATENT AND TRADEMARK OFFICE
CERTIFICATE OF CORRECTION

PATENT NO. : 6,960,925 B2
DATED : November 1, 2005
INVENTOR(S) : Branimir M. Zivanovic It is certified that error appears in the above-identified patent and that said Letters Patent is hereby corrected as shown below:

Column 21,
Line 64, delete "input buffer," and insert -- an input buffer, --.

Column 22,
Line 42, delete "first second" and insert -- first and second --.

Column 24,
Line 9, delete "rime" and insert -- time --.

Signed and Sealed this

Tenth Day of January, 2006

JON W. DUDAS
*Director of the United States Patent and Trademark Office*